United States Patent [19]

Bass

[11] Patent Number: 5,625,245

[45] Date of Patent: Apr. 29, 1997

[54] THERMOELECTRIC GENERATOR FOR MOTOR VEHICLE

[76] Inventor: John C. Bass, 6121 La Pintra Dr., La Jolla, Calif. 92037

[21] Appl. No.: 139,311

[22] Filed: Oct. 19, 1993

[51] Int. Cl.$^6$ .................................................. H02N 3/00
[52] U.S. Cl. ................................. 310/306; 322/2 R
[58] Field of Search ........................... 310/306, 62, 63, 310/308, 113, 64; 322/2 R, 2 A

[56] References Cited

U.S. PATENT DOCUMENTS

| | | | |
|---|---|---|---|
| 3,217,696 | 11/1965 | Kiekhaefer | 60/320 |
| 3,303,361 | 2/1967 | Martini | 310/306 |
| 4,148,192 | 4/1979 | Cummings | 60/716 |
| 4,927,599 | 5/1990 | Allen | 310/306 |

*Primary Examiner*—R. Skudy

[57] ABSTRACT

A thermoelectric generator for producing electric power for a motor vehicle from the heat of the exhaust gasses produced by the engine of the motor vehicle. The exhaust gasses pass through a finned heat transfer support structure which has seat positions on its outside surface for the positioning of thermoelectric modules. A good contact cylinder provides a framework from which a spring force can be applied to the thermoelectric modules to hold them in good contact on their seats on the surface of the heat transfer support structure.

6 Claims, 7 Drawing Sheets

THERMOELECTRIC GENERATOR FOR MOTOR VEHICLE

This invention was first actually reduced to practice under a contract with the United States Department of Energy and the United States government has certain rights in this invention. This invention relates to thermoelectric devices and in particular to such devices powered by waste heat.

BACKGROUND OF THE INVENTION

Engine driven "motor" vehicles typically am equipped with a battery to supply energy for starting the engine and to supply power for auxiliary electric equipment such as headlights, horn and various instruments. The power for the battery is normally provided by an alternator or a generator which is pulley driven by the crank shaft of the engine. The efficiency of these systems is generally less than about 35 percent.

The gasses exhausted from the engines of motor vehicles is at a relatively high temperature. For Diesel engine trucks the temperatures are in the range of about 850 to 1000 degrees Fahrenheit, much higher than the ambient temperature or the temperature of the engine's cooling water. These gasses normally are exhausted to the atmosphere so that the energy represented by these high temperature exhaust gasses is completely wasted.

Thermoelectric modules are currently available which can produce electric power when a substantial temperature difference is available. Specifically, thermoelectric modules are commercially available having dimensions of 2.1 inches× 2.1 inches×0.2 inch thick which will produce 13 watts when the temperature difference between its hot side and cold side is about 360 degrees Fahrenheit.

SUMMARY OF THE INVENTION

The present invention provides a thermoelectric generator for producing electric power for a motor vehicle from the heat of the exhaust gasses produced by the engine of the motor vehicle. The exhaust gasses pass through a finned heat transfer support structure which has seat positions on its outside surface for the positioning of thermoelectric modules. A good contact cylinder provides a framework from which a spring force can be applied to the thermoelectric modules to hold them in good contact on their seats on the surface of the heat transfer support structure.

DETAILED DESCRIPTION OF PREFERRED EMBODIMENTS

General Layout

Figure 1:
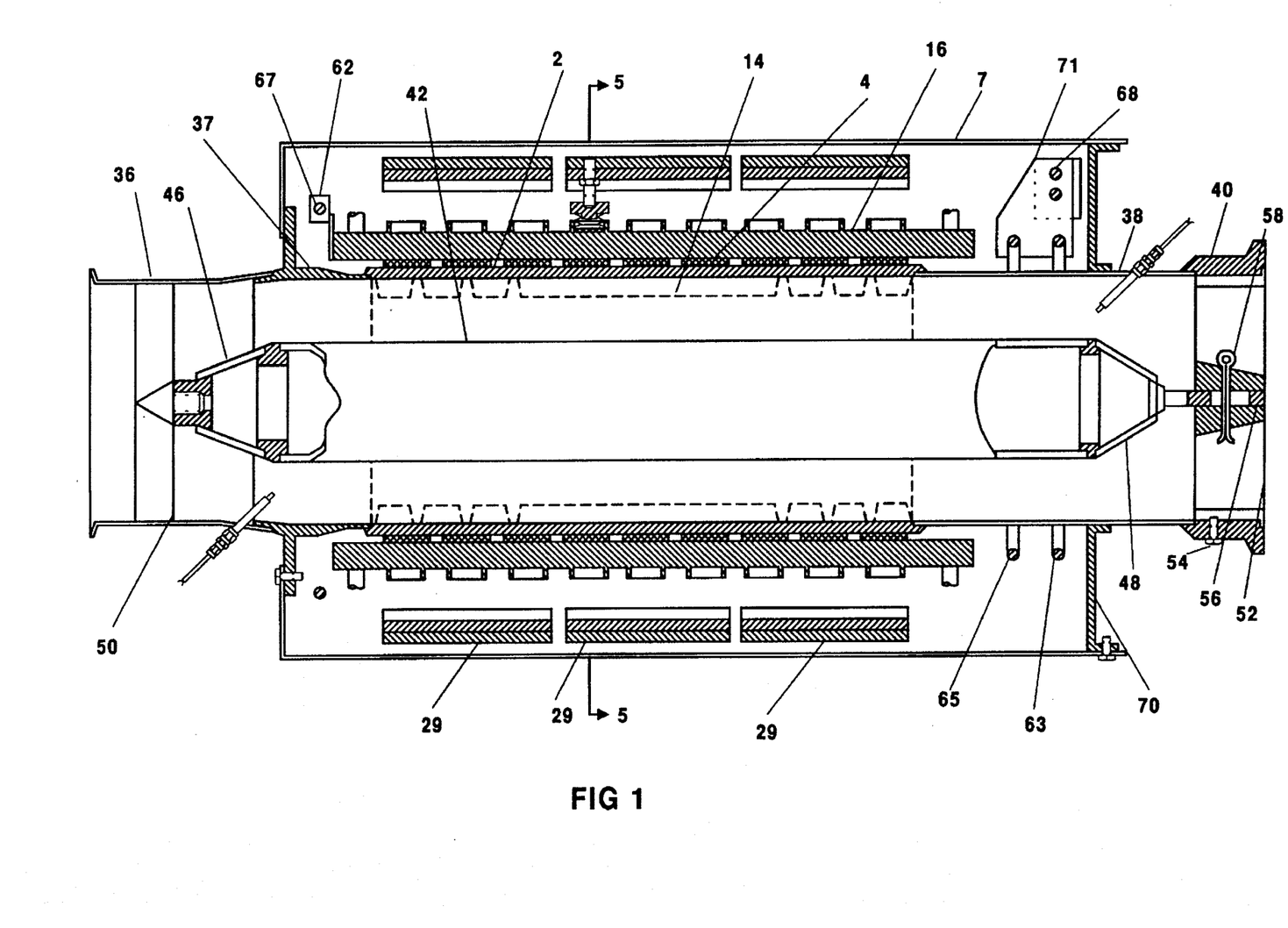
FIG. 1 is a drawing of a preferred embodiment of the present invention.
Figure 2:
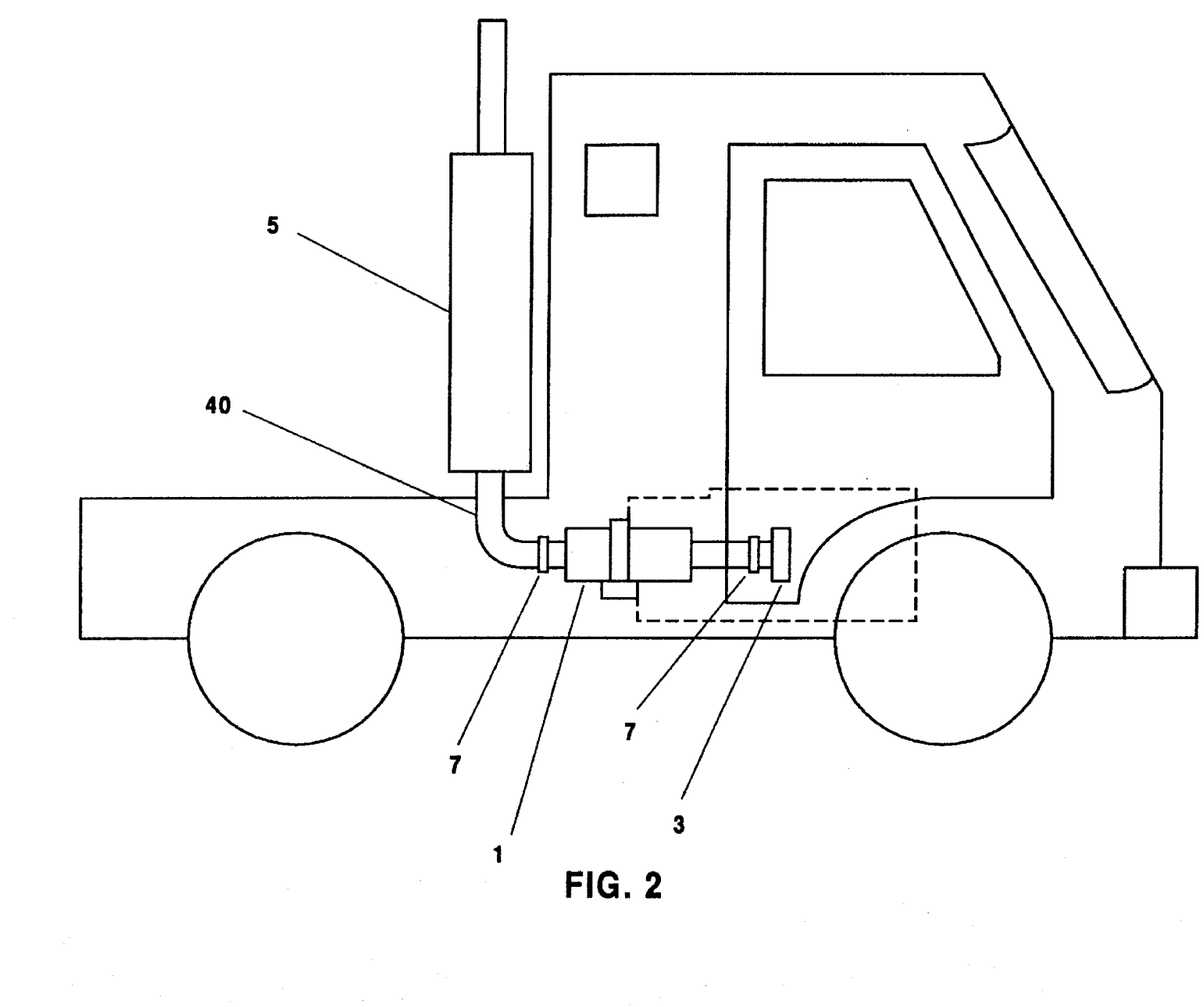
FIG. 2 is a sketch of the cab of a truck showing the location of this embodiment.
Figure 7:
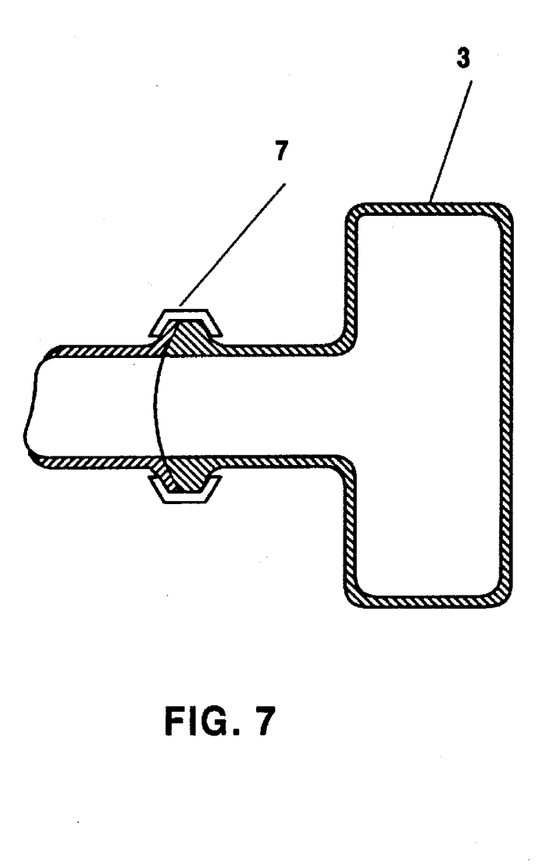
FIG. 7 shows how the generator is clamped to existing truck equipment.

A preferred embodiment of the present embedment can be described by reference to FIGS. 1 through 4. FIG. 1 is a drawing of a 1,000 watt thermoelectric generator 1 for providing electric power for the diesel engine driven 14 liter Trailways Truck from the heat of the engine's exhaust gasses. FIG. 2 shows the location of the thermoelectric generator on the truck. In this embodiment the thermoelectric generator 1 is coupled directly to the existing turbocharger 3 using a standard V-Band clamp as shown in FIG. 7. Generator 1 is upstream of muffler 5 and is connected to the muffler also with a standard V-Band clamp.

Heat Transfer Support Structure

As shown in FIG. 1 the generator utilizes a main heat transfer support structure 2 made of Cast Ni Resist iron to support 72 1.55 Volt, 13 Watt thermoelectric modules 4. As shown in FIG. 2 support structure 2 is located in the engines exhaust system at the point where the exhaust leaves the turbocharger power turbine outlet 12 of the truck's engine.

Figure 8:
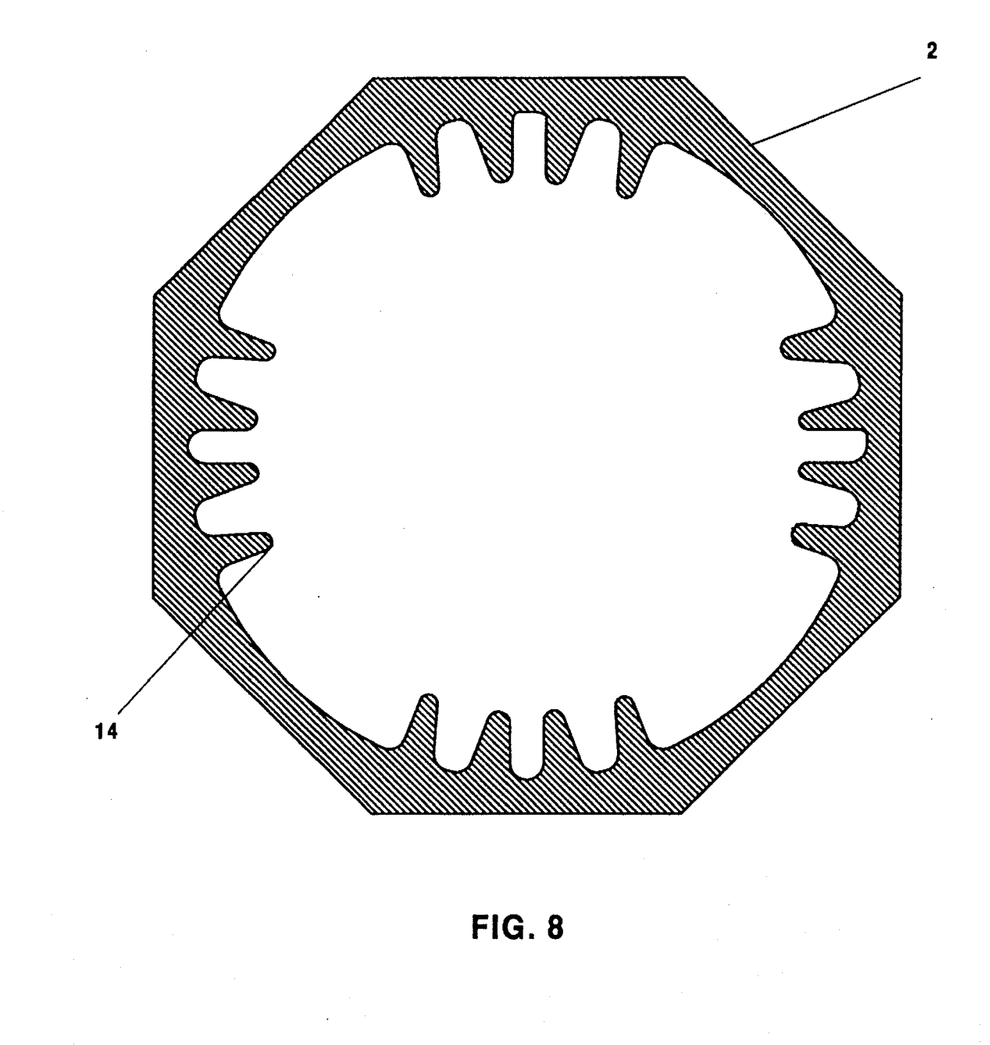
FIG. 8 shows a cross section of the heat transfer support structure.

The inside of support structure 2 is generally cylindrical and contains 40 rows of radially oriented fins 14 which provide an improved heat transfer surface. The fins are shown in cross section in FIG. 8. The outside of the support is octagonal in shape providing eight flats, each with a width wide enough to provide good seats for thermoelectric modules 4 which have dimensions of about 2.1 inches×2.1 inches with a thickness of about 0.2 inch. A thin piece of aluminum oxide (not shown) with a thickness of 0.01 inch is placed between the surface of the support structure 2 and the modules 4 for electrical insulation. Both sides of the insulator are covered with a layer of heat transfer grease such as Wakefield 120 thermal compound at a thickness of about 0.001 inches. Nine thermoelectric modules are located in line about ½ inch apart on each of the eight flats.

Thermoelectric Modules

Thermoelectric modules 4, as stated above, have dimensions of about 2.1 inches×2.1 inches with a thickness of about 0.2 inches. One of the 2.1×2.1 surface is the cold side and the other 2.1×2.1 surface is the hot surface. Thermoelectric modules of this type are commercially available from suppliers such as Teledyne Energy Systems, Inc. Each module will produce about 13 watts at a potential of 1.55 volts when subjected to a temperature differential in the range of about 400 degrees Fahrenheit.

Heat Sink

Figure 5:
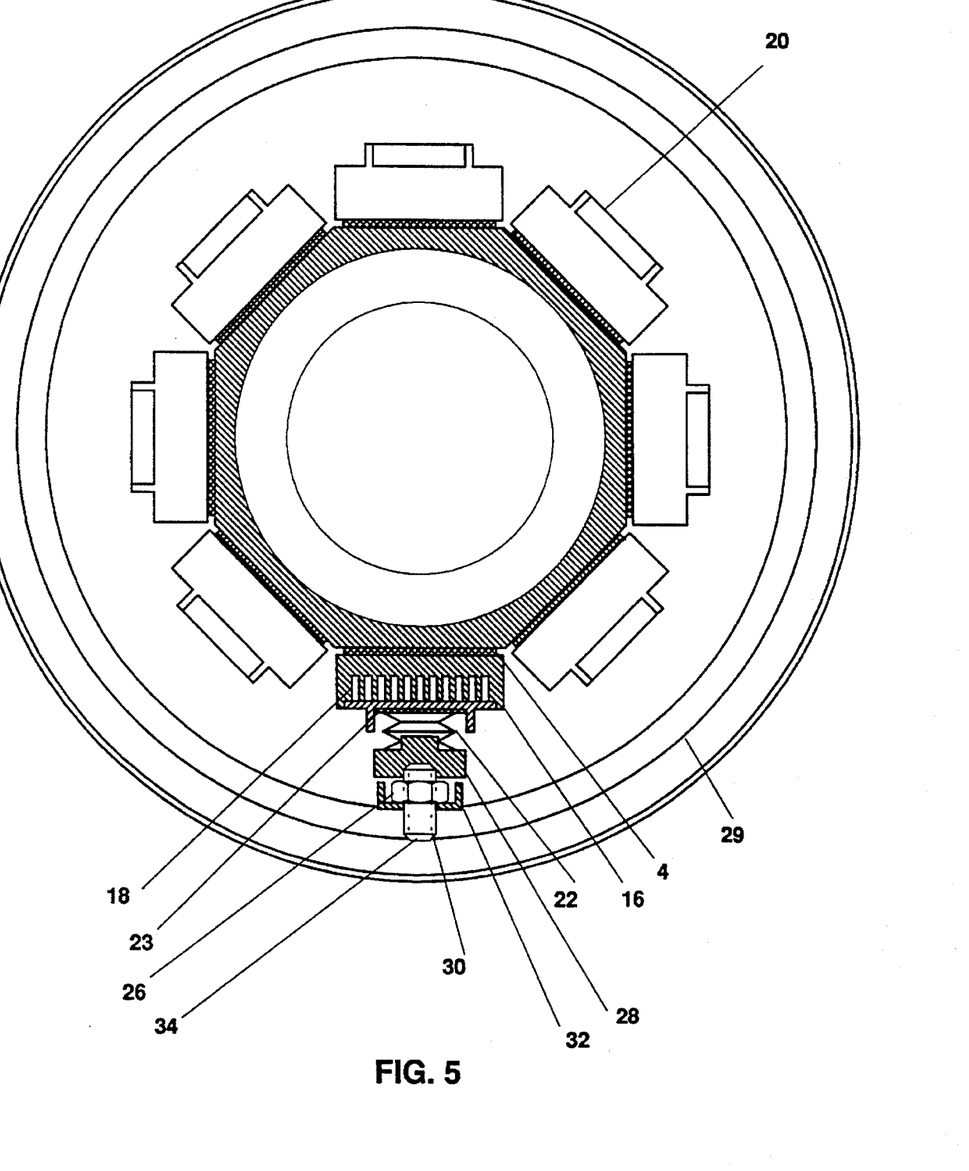
FIG. 5 is a cross section of the FIG. 1 embodiment.
Figure 6:
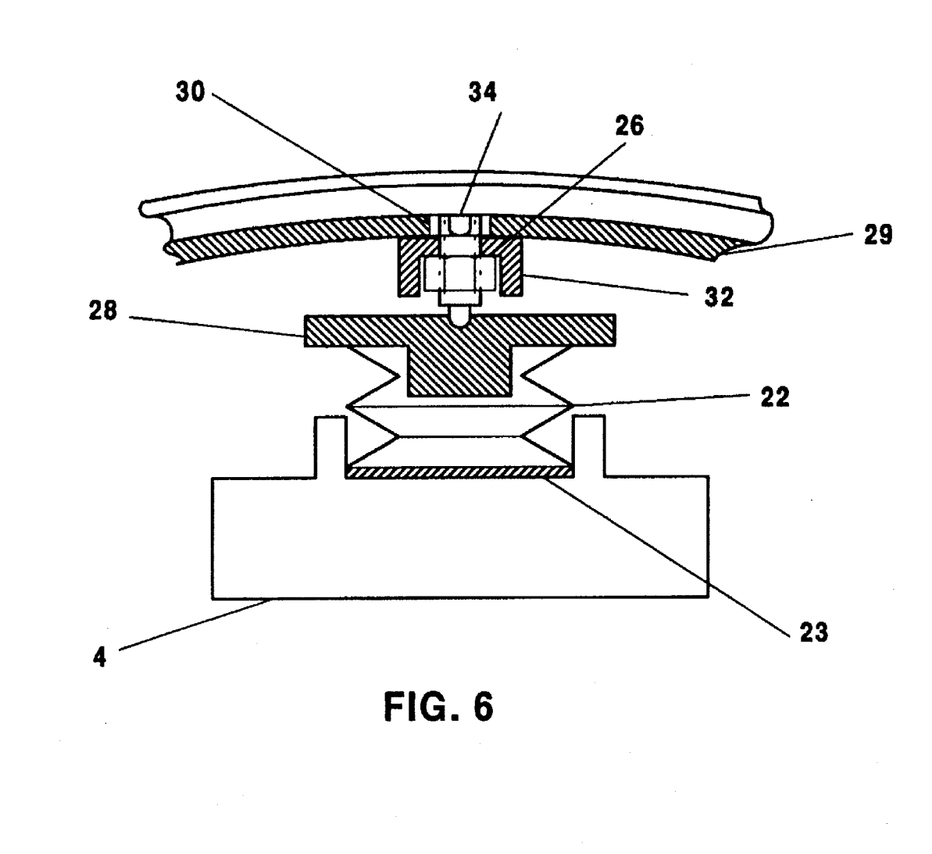
FIG. 6 shows a preferred spring arrangement to hold the modules in good contact.

A watercooled aluminum heat sink 16 is bonded to the cold side of the modules as shown in FIG. 1 with a high thermal conductivity silicon adhesive such as castable liquid from Castol, Inc. or adhesive-coated sheet form from Burquist, Inc. The heat sinks are slightly wider than a module and long enough to cover all nine modules in one flat. The inside of each heat sink contains heat sink fins 18 providing finned passages for good heat transfer from the coolant to the heat sink. The side of the heat sink away from the modules has a circular boss located at the center of each module location. Each of these bosses provide a location for a stack of four Belleville spring washers 22, a circular washer 23, and a spring follower 24 as shown in FIG. 5 or FIG. 6.

Good Contact Cylinders

Three circular aluminum cylinders 28 are placed external to the heat sinks and spring stacks. Each cylinder is long enough to cover three modules. The cylinders contain a group of 24 holes arranged in a three-by-eight array. The location of each hole in the aluminum cylinder corresponds with the location of the center of each module. A piece of channel-shaped steel 32 machined on one side to fit the curvature of the cylinder is placed radially inside each set of three holes in the cylinder. A square nut 26 with a screw 34 threaded into it is located at each cylinder hole location. One end of the screw is rounded and the other end contains a hex socket. The hex socket end is placed through the hole inside the channel and into the corresponding hole in the cylinder so the screw is oriented in the radial direction. The rounded end of the screw rests on the spring follower so that when the screw is screwed inward through the nut 26, a compressive force occurs between the spring follower and the inside of the cylinder 28. The force in the individual screws is adjusted to provide about 1000 lb. of force (at room temperature) to assure good contact in order to minimize the contact temperature drop between the module surfaces and both the hot support structure and heat sink surfaces. I estimate the force at operating temperature to be about 1150 lb.

Inlet Diffuser and Outlet End

As shown in FIG. 1 an inlet diffuser section 36 is welded to one end of the support structure 2. This diffuser connects to turbo-supercharger turbine outline flange A length of straight tubing 38 is welded to the outlet end of the support structure, and terminates in a flange 40 which is attached to the of the inlet end of muffler pipe 40 of the standard exhaust system piping of the truck as shown on FIG. 2.

Exhaust Flow Distributor

A hollow substantially cylindrical body 42 is located within the center of the support structure 2 and extends from somewhat inside the inlet diffuser section 36 to the outlet tube 38. This body 42 assures that the truck engine exhaust flow is distributed along the inner surface of heat transfer support structure 2 Both the inlet end 46 and the outlet end 48 of the body 42 are tapered so they aid in recovering the pressure that would otherwise be lost both in the exhaust gas expansion from the outlet of the turbocharger turbine and from the outlet of the thermoelectric generator support structure to the exhaust piping. I recommend a 3 inch diameter at the inlet and a 3.4 inch diameter at the outlet. The hollow substantially cylindrical body 42 is held in place by inlet and outlet spider supports 50 and 52. Inlet spider support 50 is welded into the inlet diffuser section and outlet spider support 52 is located in the end of the outlet tubing and is held in place by a screw as shown at 54. The cylinder is assembled in place by passing it through the support structure 2 from the outlet end and screwing it into the threads located in the inlet spider support 50. Outlet spider support 52 support is the slipped into place so that an axially located slotted dowel 56 in the outlet end of cylindrical body 42 passes through the hole in the center of the outlet spider support 52. The slot in the dowel in aligned with a radial hole in the hub of the outlet spider support 52, and a threaded radial hole in the outer rim of the outlet spider is aligned with a radial hole in the generator outlet flange. A cotter pin 58 is then placed through both the radial holes in the hub of the outlet spider support 52 and the slot in the dowel on the outlet end of the cylindrical body 42. A screw 60 is then placed radially through the radial hole in the outlet flange and is screwed into the threads in the rim of outlet spider support 52. This arrangement prevents the hollow cylindrical body 42 from rotating to keep it from becoming detached from the screw thread in the inlet spider while allowing the hollow cylinder to expand and contract freely relative to the support structure as will occur when the temperature of the system changes. The slot in the dowel 56 is made long enough to permit about 0.3 inch expansion of cylindrical body 42.

Electrical Circuit Arrangement

Figure 3:
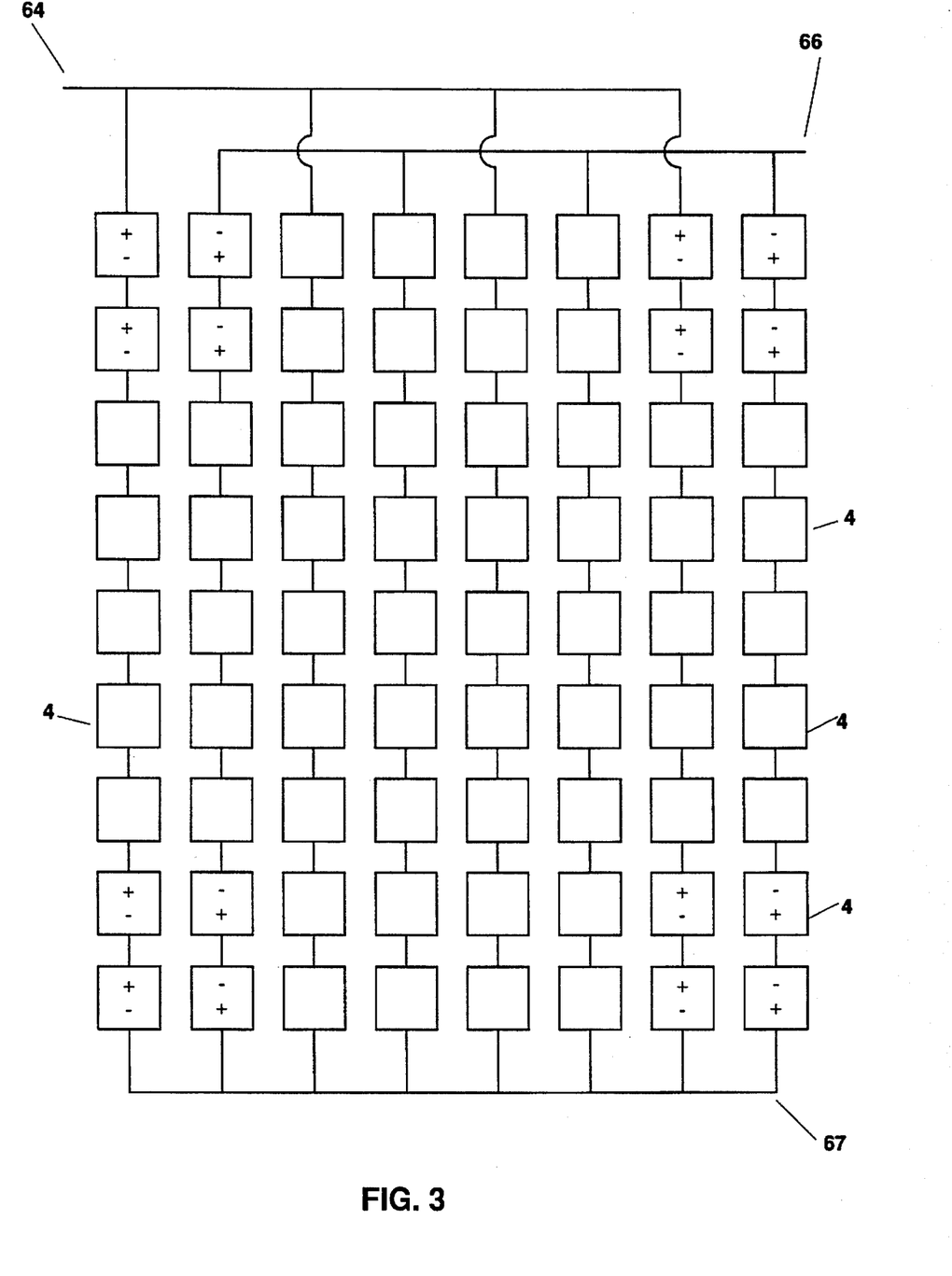
FIG. 3 shows the electric circuit combining the modules to produce 28 Volts.

Thermoelectric modules 4 are connected electrically in a series-parallel arrangement as shown in FIG. 3 to provide the desired output voltage. Each module produces a voltage potential of about 1.55 Volts. For a 14 V system, the nine modules in each of the eight rows are wired electrically in series, providing a nominal 14 V DC. Adjacent rows of modules are arranged with alternating positive and negative polarities. The rows are wired in parallel as shown in FIG. 3. The resulting parallel redundancy increases system reliability. The system reliability is further increased by the cross connections between the center points of the pairs of rows of modules as shown at the bottom of FIG. 3. This cross connection arrangement results in the loss of only one-eight of the generator power should an open failure occur in any one thermoelectric module within the generator. (For a 28 Volt system, all rows of the modules are connected to the positive and negative busses to provide a nominal 28 V DC at high current.) The two electric leads 64 and 66 which result from the above wiring scheme are connected to insulated electric terminals 68 located at the outlet end of the support structure 2. A diode circuit is placed in the electric circuit to prevent reverse flow of current from the battery to the generator when the generator is not producing sufficient power. A voltage regulator circuit prevents overcharging the trucks battery.

Cooling Circuit

Figure 4:
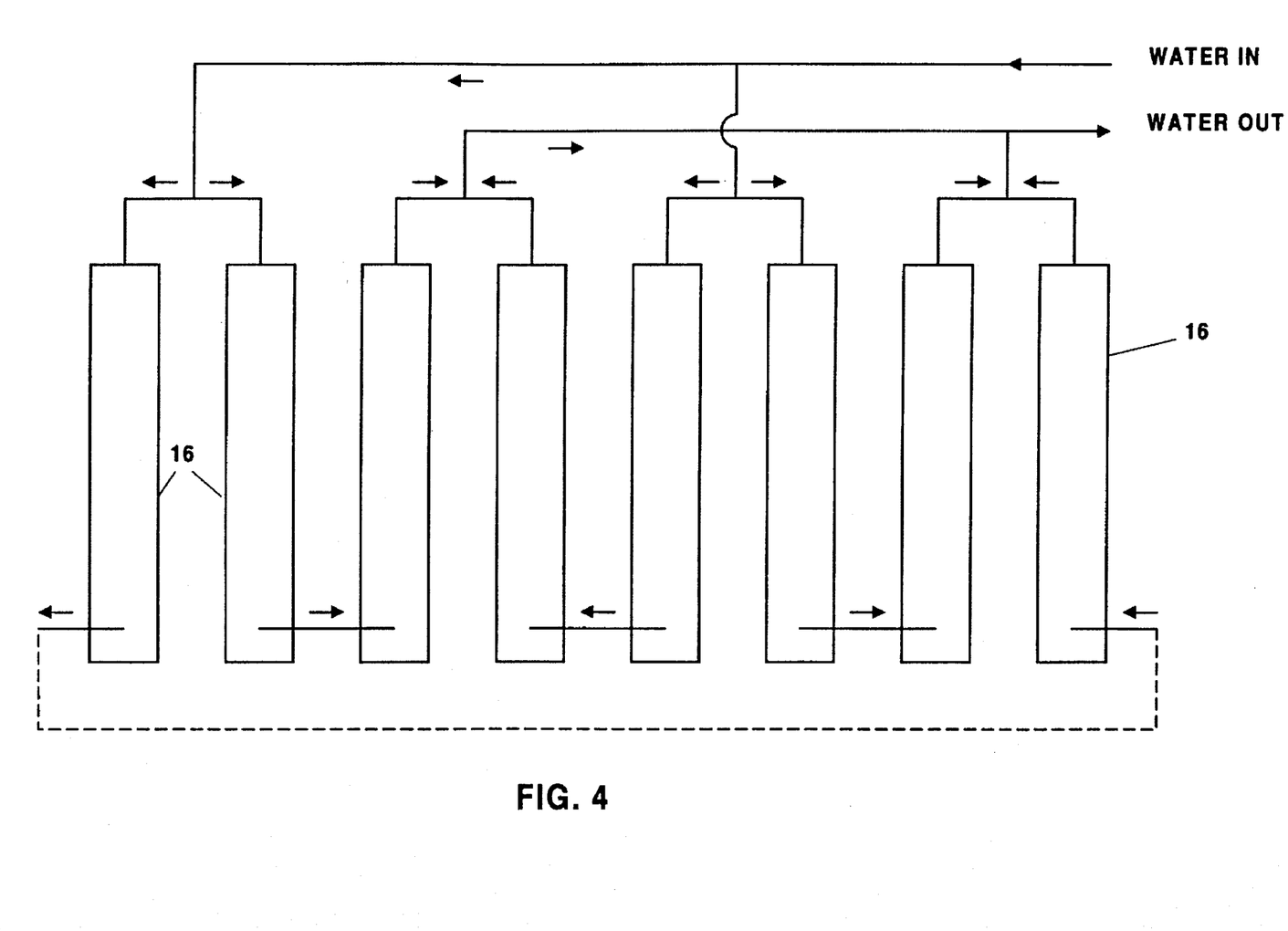
FIG. 4 is a sketch of a preferred cooling system.

In this embodiment cooling fluid from the truck's regular cooling system cools the heat sinks. The hydraulic arrangement is shown in FIG. 4. The sinks are connected as four parallel systems of two heat sinks each. Each pair of heat sinks is in turn connected in parallel with another pair to provide two inlet and two outlet coolant connections. This arrangement maintains the coolant velocities required for good heat transfer within each of the sinks without excessive temperature rise or excessive fluid pressure drop.

Conclusion

A cylindrical sheet steel cover 30 is bolted to flanges on support 2 as shown in FIG. 1. A prototype unit fabricated by my fellow workers and me have demonstrated the performance of a pre-prototype of the unit described above. The pre-prototype unit produced an output of about 400 watts. Testing of this unit has indicated the importance of maintaining good mixing of the turbulent flow of exhaust gas through the generator. As shown in FIG. 1, the fins 14 are preferable not continuous but broken at intervals to force eddies in the flow to assure additional mixing of the gas to minimize stratification of cooler gasses at the outer surface of the heat transfer support structure. I have calculated that the output of the unit described above with a better fin arrangement than the pre-prototype unit will produce about 1000 watts.

While the above description contains many specificities, the reader should not construe these as limitations on the scope of the invention, but merely as exemplifications of preferred embodiments thereof. Those skilled in the art will envision many other possible variations are within its scope. For example, the principals of this invention can be applied to motor vehicles other than Diesel engines. In addition, the generator could be placed immediately ahead of the vertically oriented muffler, moving the muffler forward by the length of the generator. This location may be preferable when the generator is a retrofit. In this case the exhaust pipe ahead of the generator should be insulated. Persons skilled in the art will recognize that the water cooled heat sink could be replaced with an air cooled heat sink. The heat transfer support structure can also be fabricated from various materials having good heat transfer qualities such as a carbon-carbon compound or a creep resistant aluminum such as a metal matrix of aluminum and silicon carbide either in fibrous or particulate form. The structure can be fabricated from flat plates rather than cast. Body 42 could be cylindrical rather than substantially cylindrical in order to same in fabrication costs. Accordingly the reader is requested to determine the scope of the invention by the appended claims and their legal equivalents, and not by the examples which have been given.

I claim:

1. A thermoelectric generator for producing electric power for an engine driven motor vehicle from heat contained in the exhaust gasses from the engine of said motor vehicle comprising:
    A) a heat transfer support structure, defining an inside surface and an outside surface, comprising:
        1) an inlet and an outlet and a passageway in between said inlet and outlet for passage of said exhaust gasses produced by said engine,
        2) a plurality of fin means located on said inside surface for improving the transfer of heat out of said exhaust gasses,
        3) a plurality of thermoelectric module seat means on said outside surface for easy seating of thermoelectric module on said outside surface,
    B) an exhaust flow distributor means positioned inside said passageway for distributing exhaust gas flow within said passageway,
    C) a plurality of thermoelectric modules defining electrical outputs seated on said thermoelectric module seat means,
    D) at least one good contact cylinder means surrounding at least a portion of said heat transfer support structure for providing a framework from which spring forces can be applied to hold said modules in good contact with the outside surface of said heat transfer support structure,
    E) a plurality of module spring means for providing a spring force between said plurality of thermoelectric modules and said at least one good contact cylinder means,
    F) a heat sink means for cooling one side of said plurality of thermoelectric modules, and
    G) an electric circuit means for connecting the electrical outputs of said plurality of thermoelectric modules in order to provide electric power to said motor vehicle.

2. A thermoelectric generator as in claim 1 said outside surface of said heat transfer support structure has a substantially octagonal cross section.

3. A thermoelectric generator as in claim 1 wherein said exhaust flow distributor means is substantially cylindrical in shape.

4. A thermoelectric generator as in claim 1 wherein said module spring means comprises a plurality of Belleville spring washers.

5. A thermoelectric generator as in claim 1 wherein said heat sink means is water cooled.

6. A thermoelectric generator as in claim 1 wherein said heat sink means is air cooled.

* * * * *